United States Patent [19]

Walker et al.

[11] Patent Number: 5,498,892
[45] Date of Patent: Mar. 12, 1996

[54] LIGHTLY DOPED DRAIN BALLAST RESISTOR

[75] Inventors: John D. Walker; Samuel C. Gioia, both of Colorado Springs, Colo.

[73] Assignee: NCR Corporation, Dayton, Ohio

[21] Appl. No.: 129,231

[22] Filed: Sep. 29, 1993

[51] Int. Cl.⁶ .......................... H01L 29/68; H01L 21/265
[52] U.S. Cl. ........................ 257/336; 257/350; 257/408; 257/536; 257/580; 257/657; 437/27; 437/30; 437/40; 437/913
[58] Field of Search .................. 257/336, 350, 257/580, 657, 408, 536; 437/27, 30, 40, 913

[56] References Cited

U.S. PATENT DOCUMENTS

| | | | |
|---|---|---|---|
| 4,276,616 | 6/1981 | Hennig | 257/336 |
| 4,506,280 | 3/1985 | Merrill | 257/580 |
| 5,237,193 | 8/1993 | Williams et al. | 257/336 |

*Primary Examiner*—Edward Wojciechowicz
*Attorney, Agent, or Firm*—Douglas S. Foote; Stuart T. Huang

[57] ABSTRACT

A field effect transistor with improved electrostatic discharge (ESD) protection has a source, a channel underlying a gate electrode and a drain. The drain includes a lightly doped ballast resistor extending across the width of the drain and separating two other drain sub-regions. One drain sub-region is located between the ballast resistor and the channel, the other drain sub-region is opposite the resistor and connected to an exterior device. The ballast resistor laterally distributes current along the width of the drain during an ESD pulse, which reduces local peak current density and reduces damage.

20 Claims, 10 Drawing Sheets

| Lot # | Volts | Pass/Fail | # Pins Failed | % Pins Failed | Comments |
|---|---|---|---|---|---|
| TE21537 | 2000 | Passed | 0 | 0 | Standard |
| TE31537 | 2000 | Passed | 0 | 0 | Ldd Ballast-15% Exp. |
| TE41537 | 2000 | Passed | 0 | 0 | Ldd Ballast, Nom. Exp. |
| TE51537 | 2000 | Passed | 0 | 0 | Ldd Ballast,+15% Exp. |
| | | | | | |
| TE21537 | 4000 | Failed | 14 | 0.04057971 | Standard |
| TE31537 | 4000 | Failed | 12 | 0.034782609 | Ldd Ballast -15% Exp. |
| TE41537 | 4000 | Failed | 12 | 0.034782609 | Ldd Ballast, Nom. Exp. |
| TE51537 | 4000 | Failed | 12 | 0.034782609 | Ldd Ballast,+15% Exp. |

FIGURE 11

|  | Results @ 2000 V | | | Results @ 4000 V | | |
| --- | --- | --- | --- | --- | --- | --- |
|  | # Pins Failing | # Pins Tested | % Pins Failing | # Pins Failing | # Pins Tested | % Pins Failing |
| Std. N. + Sheet Res./Ballast Resistor | 0 | 345 | 0 | 0 | 1725 | 0 |
| High N + Sheet Res./Ballast Resistor | 0 | 345 | 0 | 0 | 1725 | 0 |
| High N + Sheet Res./AC (14 lu) pads | 0 | 345 | 0 | 0 | 1725 | 0 |
| Std. N + Sheet Res./AC (14 lu) pads | 0 | 345 | 0 | 6 | 1725 | 0.34782609 |

|  | Results @ 2000 V | | | Results @ 4000 V | | |
| --- | --- | --- | --- | --- | --- | --- |
|  | # Pins Failing | # Pins Tested | % Pins Failing | # Pins Failing | # Pins Tested | % Pins Failing |
| Std. N. + Sheet Res./Ballast Resistor | 0 | 705 | 0 | 8 | 4230 | 0.1891253 |
| High N + Sheet Res./Ballast Resistor | 0 | 705 | 0 | 5 | 4230 | 0.11820331 |
| High N + Sheet Res./AF (23 lu) pads | 0 | 705 | 0 | 20 | 4230 | 0.47281324 |
| Std. N. + Sheet Res./AF (23 lu) pads | 0 | 705 | 0 | 217 | 3525 | 0.15602837 |

LIGHTLY DOPED DRAIN BALLAST RESISTOR

BACKGROUND

The invention relates to the general field of semiconductor devices, and in particular to a Field Effect Transistor FET having a drain with a lightly doped region acting as a ballast resistor.

Electrostatic discharge (ESD) pulses can damage or destroy integrated circuits. Protection becomes more difficult as process structures are shrunk. For submicron processes, ESD protection is a major reliability concern, and adequate ESD protection is not easily achieved.

For example, when a device receives an ESD pulse having a magnitude on the order of a thousand volts, a large voltage gradient is created between the contact and the channel. This gradient can accelerate charge carriers, ionize conduction paths, and inject electrons into the gate oxide above the channel region. This "hot carrier" effect can cause device failure through permanent damage. Even if the device does not fail, hot electrons can change the device characteristics. In addition, the conduction paths can heat up until the silicon melting point is reached and the device junctions are permanently destroyed.

SUMMARY

An object of the present invention is to provide improved ESD characteristics for semiconductor devices having field effect transistors.

Another object of the present invention is to provide improved ESD characteristics for very large scale integrated circuits made with metal oxide semiconductor devices.

Another object of the present invention is to improve process yield by reducing the number of devices manufactured with unacceptable ESD characteristics.

Another object of the present invention is to provided improved ESD characteristics with a minimum of additional manufacturing process steps.

These and other objects are accomplished by providing a ballast resistor located in the drain of a field effect transistor. The ballast resistor extends across the width of the drain. When the transistor is subjected to an ESD pulse and high currents flow across the drain (between drain contacts and the transistor channel), the ballast resistor distributes the current more evenly across the width of drain. This ballasting effect reduces peak current densities, and thus limits damage and failures.

The ballast resistor is preferably located in the drain region of the device so as to minimize the resistor's effect on normal device characteristics. However, a ballast resistor may still provide ESD protection when located on the source side, and source-side ballasting may be used when other design constraints permit.

A preferred method of making a transistor with a ballast resistor begins by forming a gate electrode and doping source and drain regions to a reduced dopant concentration level. The reduced level is the level chosen for the lightly doped ballast resistor. Then, a mask is applied that covers a portion of the drain where the ballast resistor is to be formed, but leaving exposed remaining drain regions. Additional dopant is then implanted. The mask prevents additional dopant from being implanted into the lightly doped ballast region, but other regions are brought up to an increased level.

BRIEF DESCRIPTION OF THE DRAWINGS

The invention will be described below with reference to attached drawings in which:

FIGS. 11 and 12 tabulate test data showing improved ESD performance of sample devices made with ballast resistors.

DETAILED DESCRIPTION OF THE PREFERRED EMBODIMENTS

The scope of the invention is defined by claims at the conclusion of the description of the preferred embodiments. However, the organization, operation, advantages and objects of the invention can be more fully appreciated from the following description.

An NMOS device fabricated in a silicon substrate will be described. Ones skilled in the art will appreciate that PMOS and CMOS devices can be fabricated using the invention by selecting appropriate dopant materials, and that substrates other than silicon can be used.

Figure 1:
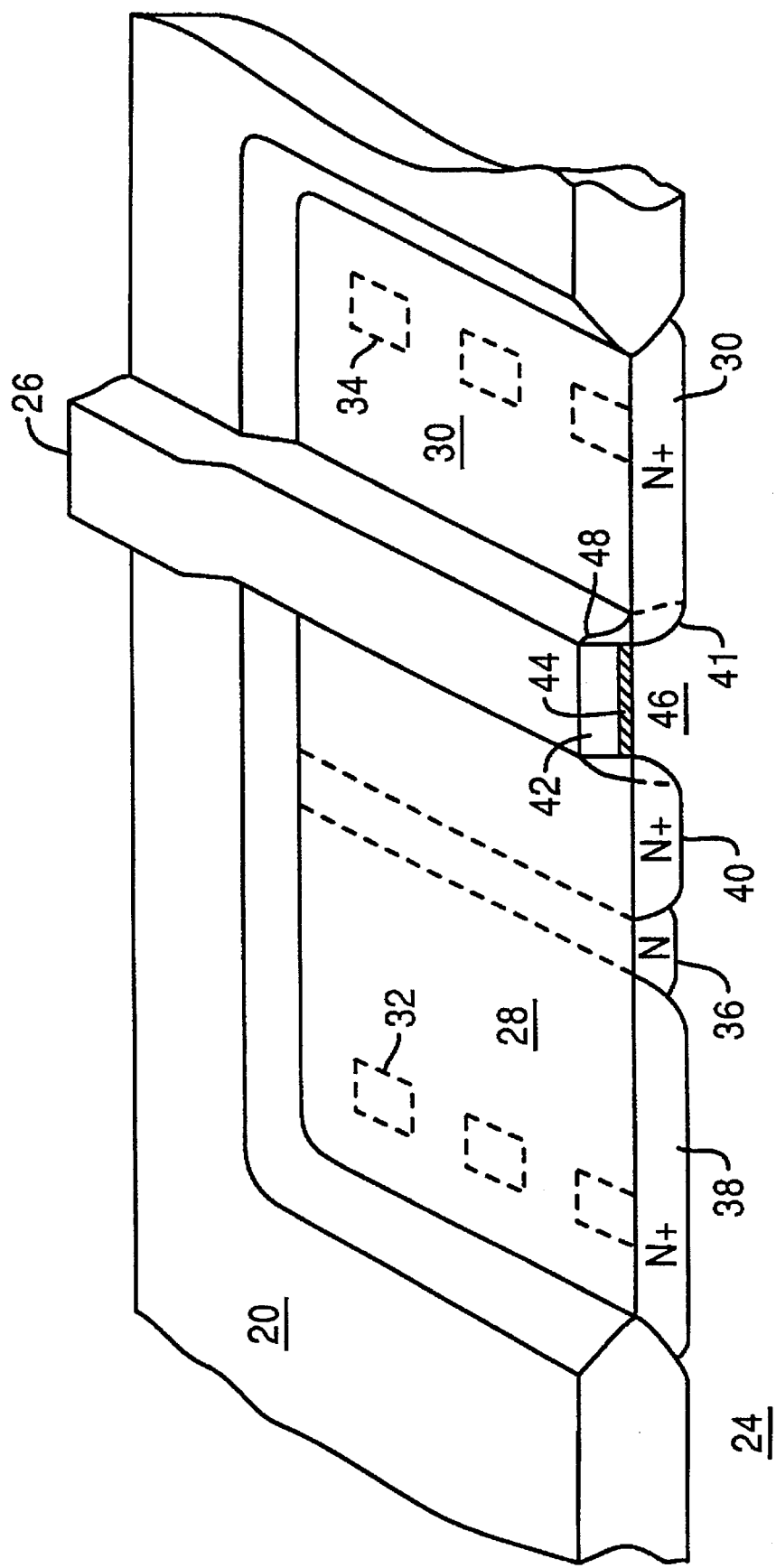
FIG. 1 illustrates a perspective view of a partially formed field effect transistor (FET) with a ballast resistor.

FIG. 1 illustrate a cut-away perspective view of a partially formed field effect transistor (FET) with a lightly doped ballast resistor. A field oxide 20 defines a bounded active region in a semiconductor substrate 24. A gate structure 26 extends across the active region from one location on the field oxide to another and divides the active region into a drain region 28 and a source region 30. Locations of drain contacts 32 and source contacts 34 are shown with broken outlines in respective drain and source regions.

For convenience, the FET will be described as having a width oriented along a direction parallel to the gate structure and having a length oriented along a direction normal to the gate structure.

The drain region 28 is an N-doped layer in an intrinsically P-doped substrate (or in a P-well). The drain region 28 has a lightly doped region 36 that extends across the full length of the drain region 32 parallel to the gate structure. The lightly doped region 36 thus separates a first region 38 to which contacts are made from a second region 40 that lies along the channel. Optionally, a second lightly doped region 41 may be formed between the second region 40 and the channel 46.

The gate structure 26 has a polysilicon electrode 42 separated from a channel region 46 of the substrate by an insulator 44. Insulating spacer regions 48 are formed on lateral edges of the polysilicon electrode 42.

The lightly doped region 36 separates first and second drain regions 38, 40 so that current flowing between the drain contacts 32 and the channel 46 must pass through the lightly doped region 36. The lightly doped region has a lower dopant concentration then the first and second drain regions 38, 40 and thus has a higher resistance.

The lightly doped region acts as a resistor that smooths current flow across the width of the drain, and thus prevents local peaks in the drain and substrate which might lead to local charge injection, snapback breakdown, heating, and device damage. (This lightly doped, high resistance region 36 will be designated as a ballast resistor 36.) The ballast resistor 36 also acts as an N-Channel depletion JFET or pinched resistor. The resistance of the device will increase with applied voltage.

In this embodiment, the source region is shorter in length than the drain, and does not have a ballast resistor. The relative length of source and drain regions is not critical to the invention. Output drive performance can be maintained when the resistor is added to the drain side of the NMOS device only. Where output drive performance must be maintained, processes should be avoided which might produce the resistor on the source side of the gate.

Figure 2:
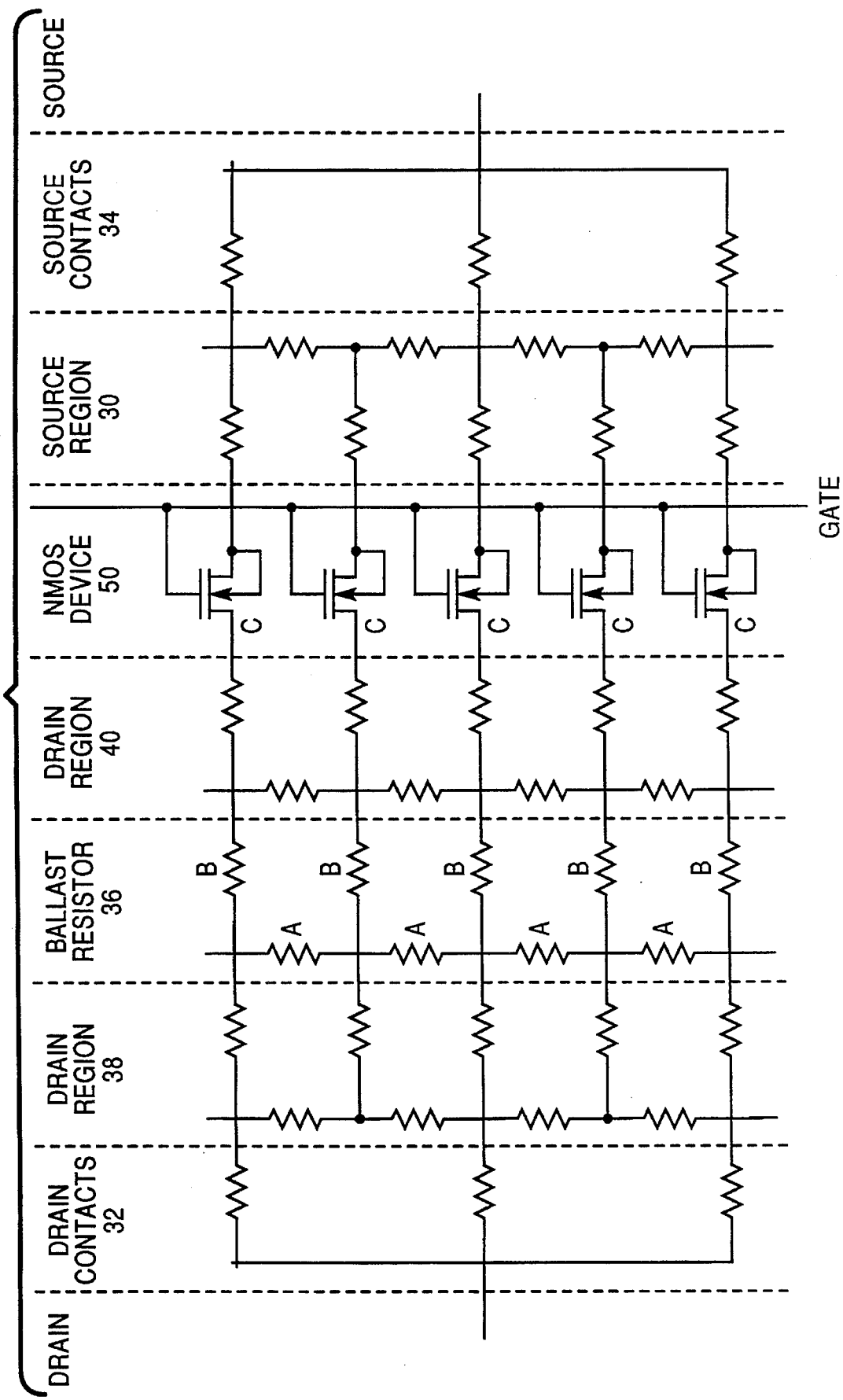
FIG. 2 illustrates a circuit representation across the width of the FET of FIG. 1.

FIG. 2 illustrates a qualitative circuit representation across the width of the MOSFET of FIG. 1. This circuit is suitable for use in a circuit simulation program, such as SPICEs to demonstrate the current leveling effect of the ballast resistor. The width of the gate structure 32 is represented as a series of MOS elements 50. With reference to the numbering scheme in FIG. 1, is the ballast resistor is shown as a set of serial and parallel resistors A and B in region 36. The remaining drain regions 40 and 38, drain contacts 32, source resistors 30 and source contacts 34 are modeled as serial and parallel resistors. The ballasting effect can be demonstrated by simulating the structure in FIG. 2 with and without the ballast resistors and by measuring the drain current at nodes C. The ballast resistors should be set to a resistance ten times that of the other drain and source resistors.

Figure 3:
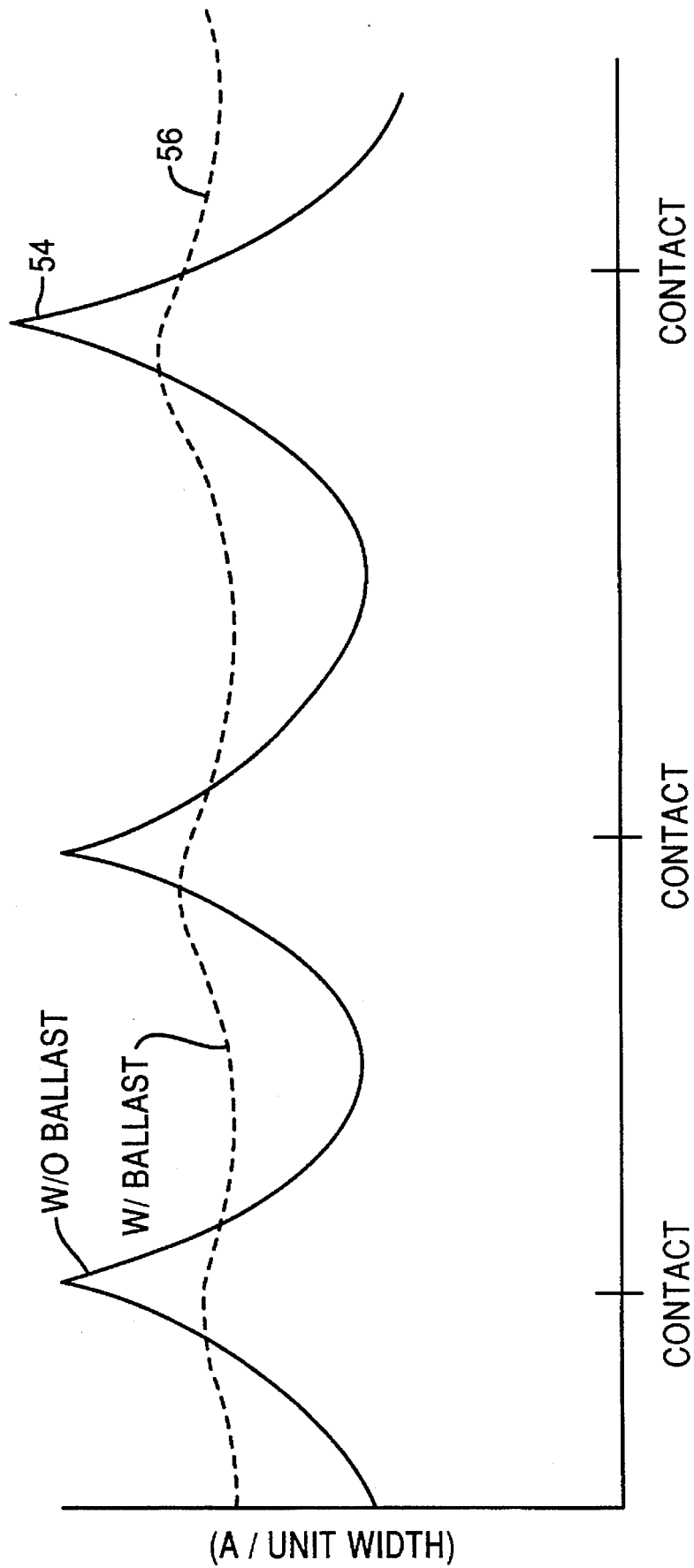
FIG. 3 illustrates a relationship between current density and location across the width of the drain of the FET of FIG. 1.

FIG. 3 illustrates a relationship between current density and location across the width of the drain of the FET of FIG. 1. The solid line depicts current density without the ballast resistor, while the dashed line depicts current density with the ballast resistor. The ballast resistor reduces the peak drain current, and hence reduces the peak substrate current. This reduces electron injection due to the "hot electron" effect which might otherwise cause "soft" ESD failure. The ballast resistor also reduces the chance of localized heating near the drain contacts which could damage the device.

Figure 4:
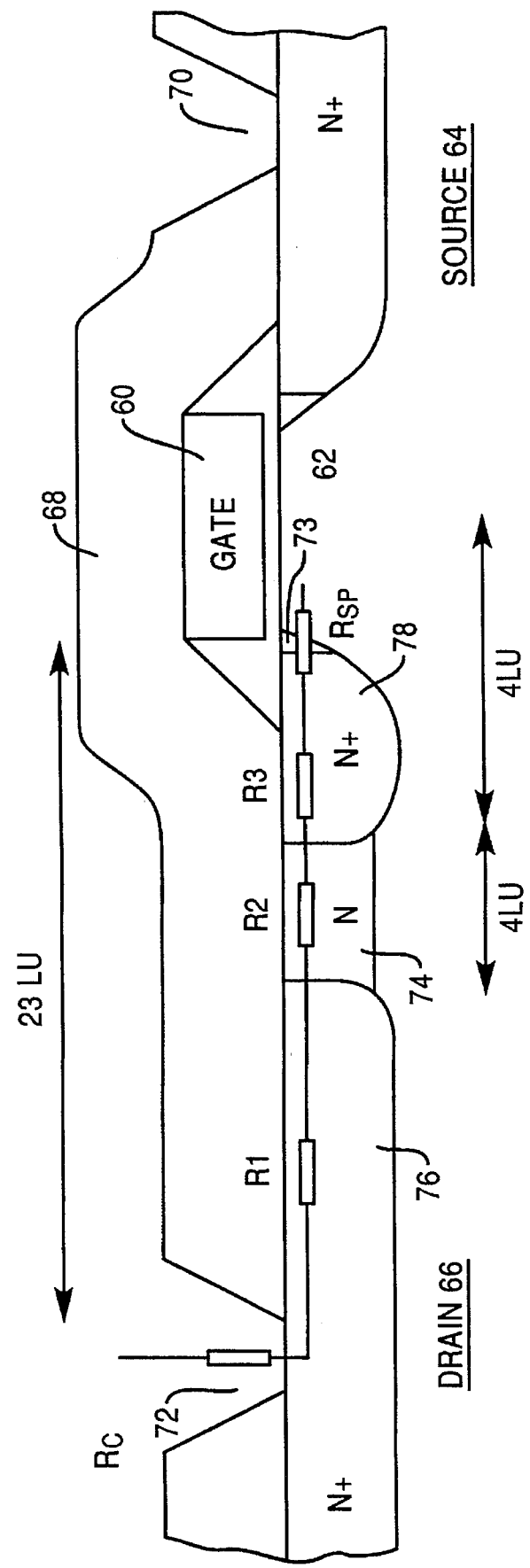
FIG. 4 illustrates elements in a quantitative resistance analysis of a length-wise cross-section of the FET of FIG. 1.

FIG. 4 illustrates elements in a quantitative resistance analysis of a length-wise cross-section of the FET of FIG. 1. It shows a gate 60 overlying a channel 62 which, in turn, separates a source region 64 from a drain region 66. An insulating layer 68 covers the gate 60 and most of the source and drain regions 64,66, except for contact openings 70, 72. The drain region 66 has a ballast resistor 76 that separates a first drain region 76 (to which contact attach) from a second drain region 78 (adjacent to the channel 62). An optional second lightly doped region 73 is also shown.

The resistance analysis accounts for resistance of the contact to the drain Rc, resistance across the first drain region R1, resistance across the ballast resistor R2, resistance across the second drain region R3, and spreading resistance due to the optional second lightly doped region Rsp. For a ballast resistance of about 750 ohms/sq, and drain resistance otherwise of about 53 ohms/sq, contemplated path resistances for a device with a width of 15 microns and dimensions as shown in the diagram are as follows:

Rc = 10 ohms
R1 = 15 ohms
R2 = 60 ohms
R3 = 5 ohms
Rsp = 10 ohms total = 100 ohms Approximate relative distances are shown as "layout units" (LU) which may be scaled to provide devices of differing geometries. One exemplary embodiment is contemplated with one LU equal to a length of approximately 0.3 microns. At this scale, a device would have a width of about 15 microns.

Figure 5:
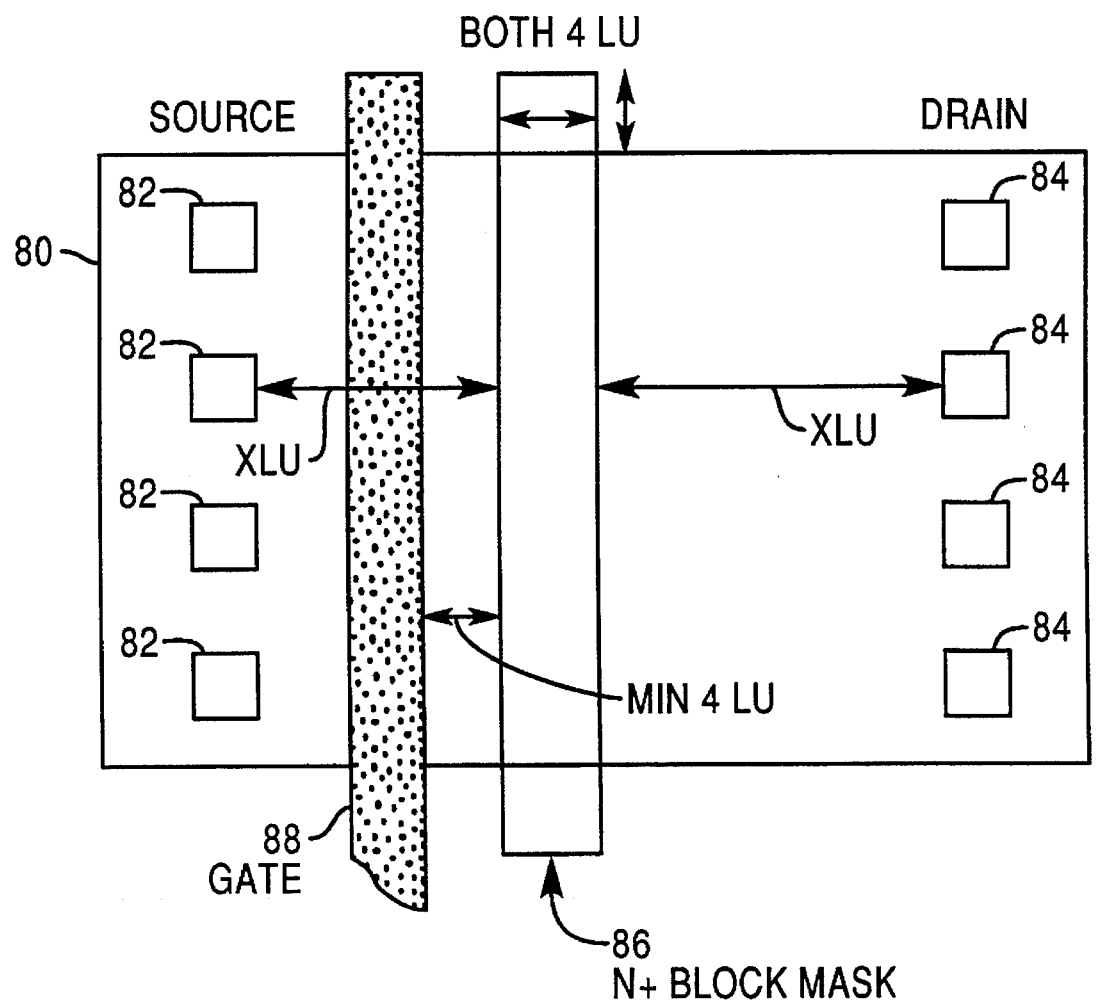
FIG. 5 illustrates a view looking down through a mask onto the surface of a partially formed FET at a second step of implanting ions into the source and drain regions.

FIG. 5 illustrates a view looking down through a mask onto the surface of a partially formed FET at a second step of implanting ions into the source and drain regions. Although the process will be discussed more fully below, the mask helps visualize the geometry of the device.

The border of the active region 80 is depicted as a heavy rectangle. Source and drain contact locations 82, 84 are located at opposite ends of the active regions. An N+ block mask 86 identifies the location of the ballast resistor and is located approximately mid-way between the contact locations. The gate structure 88 is located between the ballast resistor and the source contact locations 82. The ballast resistor can be expected to heat during an ESD pulse. It is desirable to separate the ballast resistor from the contact locations to avoid contact annealing and to avoid possible snapback voltage which might result when a large current crosses the relatively high resistance.

When alignment sensitive methods are used to locate the ballast resistor, it is also desirable to separate the ballast resistor from the gate. This reduces the likelihood that the gate structure will interfere with the resistor formation process. Interference might result in a shortened or lengthened ballast structure with reduced or increased resistance. Separating the gate and ballast resistor also removes the gate from thermal effects that occur when the ballast resistor experiences high ESD current flows.

Figure 6:
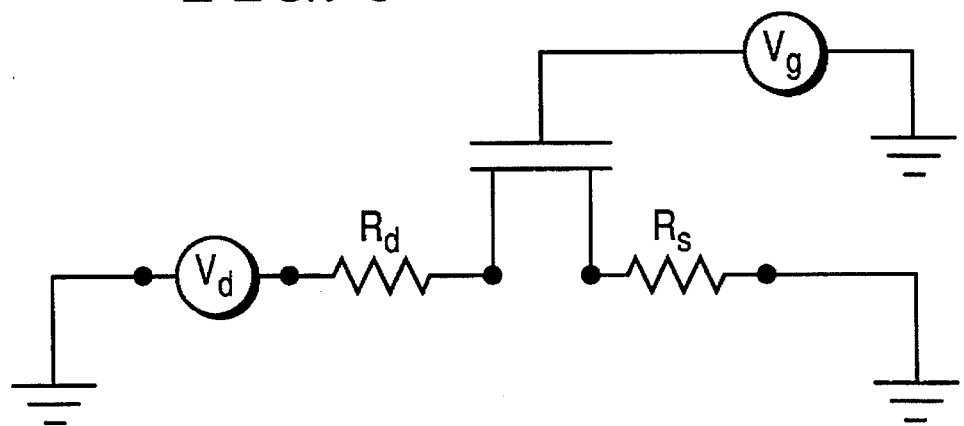
FIG. 6 illustrates a general model of a MOS FET for analysis of MOS source and drain resistance 1.

FIG. 6 illustrates a model of a FET having a ballast resistor as shown in FIG. 1. A first voltage Vg is applied to the gate of an ideal FET, while a second voltage Vd is applied to the drain through a drain resistance Rd. The source is connected through a source resistance to ground.

Figure 7:
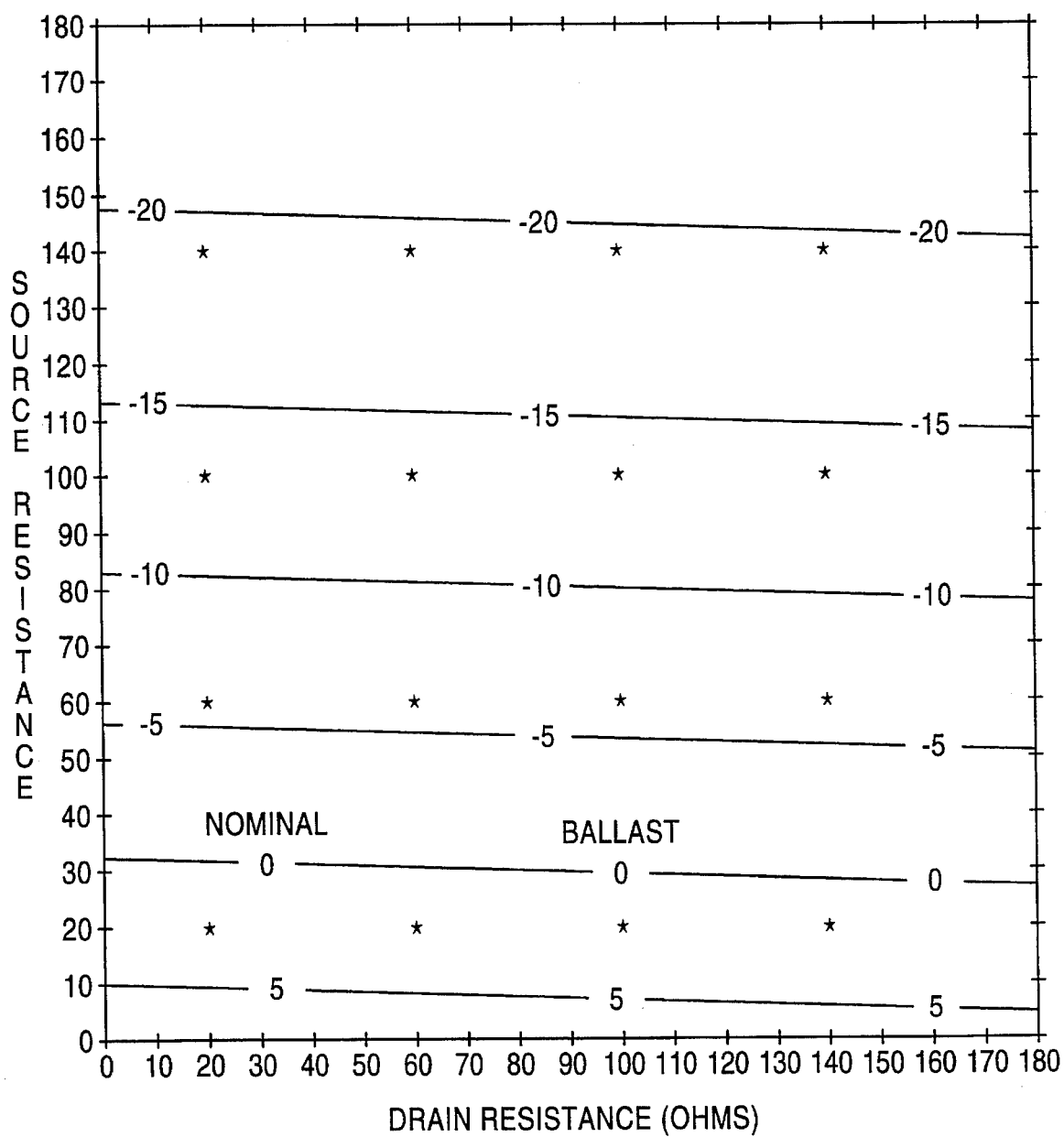
FIG. 7 illustrates results of a percentage change in NMOS drain current analysis using the model of FIG. 6.

FIG. 7 illustrates results of an analysis using the model of FIG. 6. The voltage levels Vd and Vg are taken to be 5 v. Percentage change in drain saturation currents for each of several current values (5, 0, −5, −10, and −20) is shown as a function of source and drain resistances. A point designated "NOMINAL" corresponds to a 30–31 ohm drain resistance without ballast resistor, while a second point designated "BALLAST" corresponds to a 100 ohm drain resistance with ballast resistor. As can be seen from the shallow slope of the "0" current line, the change in drain current is slight when adding the ballast resistor. This can be interpreted as showing that the ballast resistor has very little effect on the device characteristic, and that improved ESD protection can be acquired with very little effect on current performance. Additionally, it can be seen that a change in source resistance has a large effect in the drain saturation current.

Figure 8A:
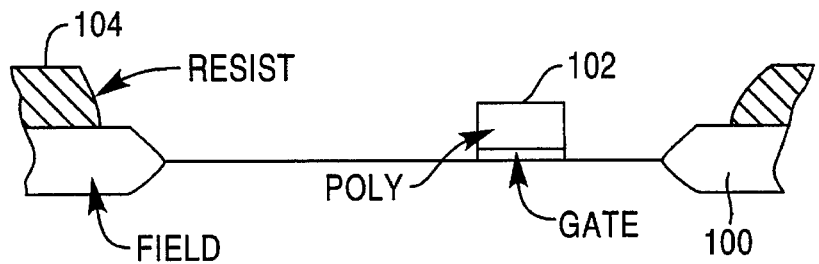
FIGS. 8a–8c illustrate initial steps of making a FET having a lightly doped drain ballast resistor.
Figure 8B:
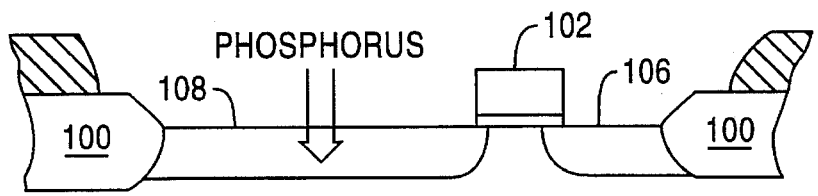
Figure 8C:
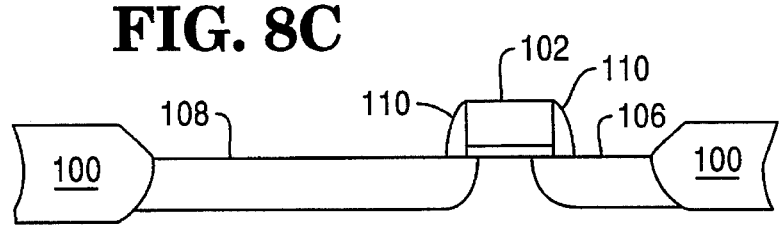
Figure 9A:
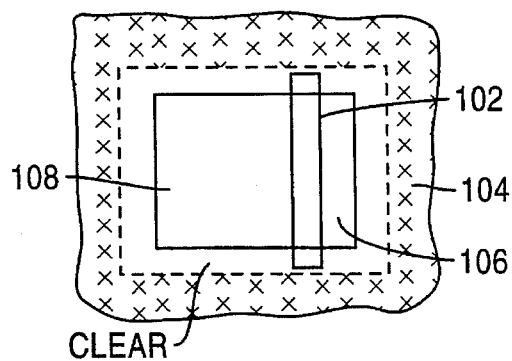
FIGS. 9a and 9b illustrate masks for implanting ions into a partially formed FET.

FIGS. 8a–8c illustrate initial steps of making a FET having a ballast resistor. In FIG. 8a, a field oxide 100 has already been formed to define an active region, and a polysilicon gate contact 102 has been formed above a gate insulator. A resist pattern 104 has also been formed that leaves exposed the active region of a device that will receive the ballast resistor. FIG. 9a shows a mask pattern, with the polysilicon gate contact already formed.

In FIG. 8b, a first concentration of dopant is implanted into the source and drain regions. In this embodiment, the dopant is phosphorous. This concentration level will ultimately determine the concentration in the ballast resistor and an optional second light doped region immediately adjacent to the channel. The polysilicon gate electrode is also doped at this time.

In FIG. 8c, the resist pattern has been removed, and a glass spacer has been formed on the lateral edges of the gate electrode. Up to this point, NMOS FETs that will have a ballast resistor have been processed in the same manner as other NMOS FETs on the wafer.

Figure 9B:
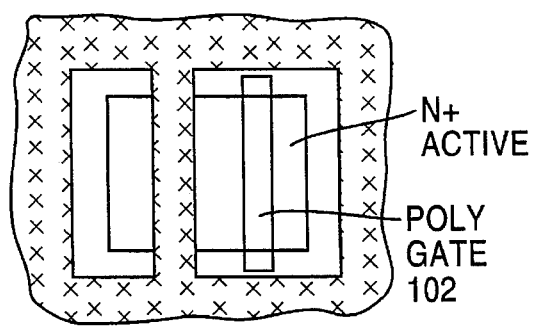
Figure 10A:
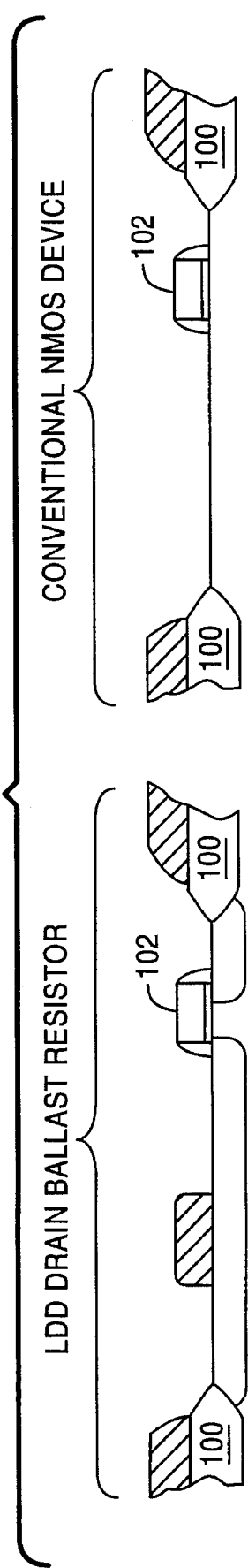
FIGS. 10a–10b illustrate additional steps of making a FET having a lightly doped drain ballast.

In FIG. 10a, a first device is shown on the left that will receive a ballast resistor, and a second device that will not receive a ballast resistor is juxtaposed on the right. A second mask has been applied that partially covers the device in the region where the ballast resistor will be formed. FIG. 9b shows such a mask pattern.

Figure 10B:
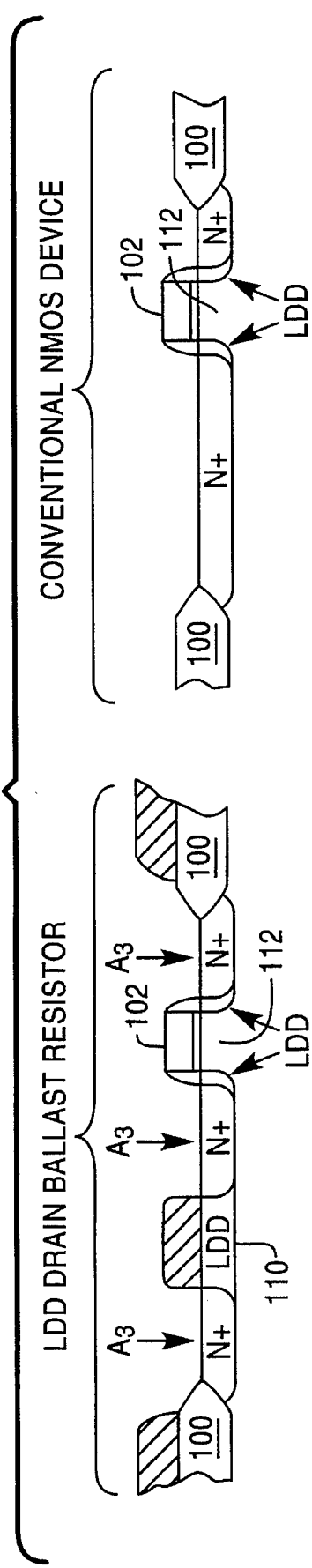

In FIG. 10b, a second implantation step is performed with arsenic. This second implantation increases the N-dopant concentration in the source and drain regions (as well as the gate electrode); however, the second mask and the gate spacer block the second implantation and leave lightly doped regions in the ballast resistor region 111 and in a relatively narrow region adjacent to the channel LDD. While ballast resistors are formed in selected devices, other devices receive the full implantation. In these other devices, lightly doped regions LDD are only formed under the spacers, adjacent to the channel.

FIGS. 11 and 12 tabulate test data showing improved ESD performance of sample devices made with ballast resistors. FIG. 11 shows test results from four prototype devices. A first group of 4 devices were made, one without a ballast resistor (TE21537), and three with ballast resistors (TE 31537, 41537 and 51537). The three devices with ballast resistors were made by varying the exposure, and thus the resistance, of the ballast resistor by ±15% from nominal. Input/output pins of these devices were tested with 2000 volts, and none failed.

The four devices then were tested at 4000 volts. Here, the standard device without ballast resistor showed failure on 14 pins, while each of the ballasted devices showed only 12. This data can be interpreted as showing that ballast resistors show improvement.

FIG. 12 shows test results on sixteen batches of prototype devices. The first eight batches were made with device lengths (distance from drain contact to gate) of 14 LU's, while the second eight batches were made with device lengths of 23 LU 's.

The first four batches of 14 LU devices were tested at 2000 v, and the second four batches were tested at 4000 v. Of the first four batches, two had ballast resistors and two did not. One of the batches with ballast resistors was made with a nominal N+ sheet resistance (N+ being the drain regions in front of and behind the ballast resistor), and another was made with sheet resistance increased by 15%. Similarly, one batch of non-ballast devices was made with standard N+ sheet resistance, while a second non-ballast batch was made with high N+ resistance.

As can be seen, six of 345 I/O pins of the standard device with high N+ sheet resistance failed at 4000 v. None of the I/O pins of the ballast devices failed at either voltage. This data can be interpreted as showing that the ballast resistor provides increased ESD margin.

The second set of eight batches is similar to the first batch except that the distance from drain contact to gate has been increased to 23 LU 's. The standard N+ ballast devices showed only 8 of 705 pin failures, while the standard N+ non-ballast devices showed 217 failures. Similarly, the high N+ ballast resistors showed only 5 of 705 failures, while the high N+ non-ballast devices showed 20 of 705 failures. Again, this data can be interpreted as showing that the ballast resistor provides increased ESD margin.

It must be noted that the same ballasting effect can be achieved by increasing the drain contact to polysilicon gate space. Assuming that the ballast resistor has a sheet resistance that is 15 times that of the drain sheet resistance and that the ballast resistor is 1.5 microns wide, the drain contact to gate space would have to be increased by 15×1.5 or 22.5 microns to provide the same ballasting effect without the ballast resistor.

The ballast resistor leads to a great improvement in drain contact to polysilicon gate space for devices that need a large space for ESD protection. The reduced space realized by the ballast resistor also reduces the drain area which reduces the drain capacitance of the MOS device. This might lead to a faster switching MOS device if switching speed is critical to the device design.

For designs that already have large MOS drain to polysilicon gate spacing for ESD protection and for MOS processes that use an LDD mask and implant, the ballast resistor can be added to the existing MOS device without having to redraw and reorder masks for all other layers in the circuit. Thus, the new ballast resistor structure can easily be retrofitted to suitable designs.

After learning of the embodiments described above, people practicing in this art will be able to make variations that fall within the spirit and scope of the invention. The embodiments described above are exemplary but not intended to limit unduly the scope of the invention as defined by the following claims.

What is claimed is:

1. A field effect transistor with improved ESD protection comprising:

a source region of a first dopant type;

a channel region of a second dopant type underlying a gate electrode; and a drain region of the first dopant type separated from the source region by the channel region;

wherein the drain region includes a ballast region separating second and third drain sub-regions, the second drain sub-region being located between the ballast region and the channel, the third drain sub-region being connected to a device exterior to the transistor; and wherein the ballast region has a resistance greater than that of the first and second drain regions, thereby laterally distributing current flowing between the channel region and signal connection points.

2. The transistor of claim 1 wherein the drain region further comprises a lightly doped drain sub-region located between the channel and the second drain sub-region.

3. The transistor of claim 1 wherein the sheet resistance of the ballast region is at least an order of magnitude greater than individual resistances of the second and third drain sub-regions.

4. The transistor of claim 1 wherein the concentration of dopant in the ballast region is at least an order of magnitude lower than individual concentrations in the second and third drain sub-regions.

5. The transistor of claim 1 wherein the concentration of dopant in the ballast region is between about $1 \times 10E17/cm^2$ and about $5 \times 10E18/cm^2$, and the concentration of dopant in the second and third drain sub-regions is greater than about $1 \times 10E20/cm2$.

6. The transistor of claim 1 wherein the lightly doped ballast region is displaced from the gate electrode by a distance of at least about the length of the ballast region.

7. The transistor of claim 1 wherein the length of the drain region is greater than the length of the source region.

8. The transistor of claim 1 wherein the third drain sub-region is connected to a device exterior to the transistor through multiple discrete contact locations.

9. A method of making a field effect transistor in a semiconductor substrate comprising steps of:

forming a field oxide isolating an active region in the semiconductor substrate;

forming an insulated gate electrode above a channel region of the active region, said gate electrode extending across the active region, thereby separating a source region from a drain region;

doping the drain region with a first concentration of a first dopant type, increasing the dopant in second and third sub-regions of the drain region while leaving a lightly doped ballast sub-region, said ballast sub-region extending across the drain region, said second sub-region separating the ballast sub-region from the channel region, said ballast sub-region separating the second sub-region from the third sub-region;

forming signal contact points in the third drain sub-region; and completing fabrication of the transistor.

10. The method of claim 9 wherein:

the step of doping the drain region uses a first dopant of the first dopant type; and the step of increasing the dopant in the second and third drain sub-regions uses a second dopant of the first dopant type.

11. The method of claim 9 further comprises a step of:

forming a sidewall spacer along edges of the gate electrode prior to increasing the dopant in second and third sub-regions; and wherein the step of increasing the dopant in the second and third sub-regions leaves a lightly doped drain region under the sidewall spacer.

12. The method of claim 9 wherein the step of increasing the dopant in the second and third drain sub-regions comprises steps of:

applying a mask to the drain region, said mask covering the ballast sub-region and leaving exposed the second and third drain sub-regions; and implanting dopant ions into the exposed second and third drain sub-regions.

13. A field effect transistor with improved ESD protection comprising:

a drain region of a first dopant type;

a channel region of a second dopant type underlying a gate electrode; and a source region of the first dopant type separated from the drain region by the channel region;

wherein the source region includes a ballast region separating second and third source sub-regions, the second source sub-region being located between the ballast region and the channel, the third source sub-region being connected to a device exterior to the transistor; and wherein the ballast region has a resistance greater than that of the first and second source regions, thereby laterally distributing current flowing between the channel region and signal connection points.

14. The transistor of claim 13 wherein the source region further comprises a lightly doped source sub-region located between the channel and the second source sub-region.

15. The transistor of claim 13 wherein the sheet resistance of the ballast region is at least an order of magnitude greater than individual resistances of the second and third source sub-regions.

16. The transistor of claim 13 wherein the concentration of dopant in the lightly doped ballast region is at least an order of magnitude lower than individual concentrations in the second and third source sub-regions.

17. The transistor of claim 13 wherein the concentration of dopant in the ballast region is between about $1 \times 10E17/cm2$ and about $5 \times 10E18/cm2$, and the concentration of dopant in the second and third source sub-regions is greater than about $1 \times 10E20/cm2$.

18. The transistor of claim 13 wherein the ballast region is displaced from the gate electrode by a distance of at least about the length of the ballast region.

19. The transistor of claim 13 wherein the length of the source region is greater than the length of the drain region.

20. The transistor of claim 13 wherein the third source sub-region is connected to a device exterior to the transistor through multiple discrete contact locations.

* * * * *